(12) United States Patent
Kajiyama

(10) Patent No.: US 8,587,042 B2
(45) Date of Patent: Nov. 19, 2013

(54) MAGNETORESISTIVE RANDOM ACCESS MEMORY DEVICE

(75) Inventor: Takeshi Kajiyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 430 days.

(21) Appl. No.: 12/719,729

(22) Filed: Mar. 8, 2010

(65) Prior Publication Data

US 2011/0012179 A1    Jan. 20, 2011

(30) Foreign Application Priority Data

Jul. 14, 2009  (JP) ................. 2009-165933

(51) Int. Cl.
*H01L 21/02* (2006.01)
(52) U.S. Cl.
USPC ........................................................ 257/295
(58) Field of Classification Search
USPC .......... 257/295, E27.104, 296, 300, 421, 659, 257/108, E43.004
See application file for complete search history.

(56) References Cited

U.S. PATENT DOCUMENTS

| | | | |
|---|---|---|---|
| 7,457,150 B2 | 11/2008 | Tsuchida et al. | |
| 7,529,114 B2 | 5/2009 | Asao | |
| 7,745,894 B2 | 6/2010 | Asao et al. | |
| 2007/0258281 A1 | 11/2007 | Ito et al. | |
| 2008/0165454 A1* | 7/2008 | Kajiyama | 360/324.2 |

FOREIGN PATENT DOCUMENTS

| | | |
|---|---|---|
| JP | 2002-353418 | 12/2002 |
| JP | 2007-300079 A | 11/2007 |
| JP | 2007-317795 A | 12/2007 |
| JP | 2008-091703 A | 4/2008 |
| JP | 2008-123641 | 5/2008 |
| JP | 2008-123641 A | 5/2008 |
| JP | 2008-130995 A | 6/2008 |

OTHER PUBLICATIONS

Notification of Reasons for Refusal dispatched on Jun. 18, 2013 in corresponding Japanese Pat. App. No. 2009-165933 in five pages.

* cited by examiner

*Primary Examiner* — Chuong A Luu
*Assistant Examiner* — Nga Doan
(74) *Attorney, Agent, or Firm* — Knobbe, Martens, Olson & Bear, LLP

(57) ABSTRACT

An aspect of the present disclosure, there is provided a magnetoresistive random access memory device, including, an active area formed on a semiconductor substrate in a first direction, a magnetoresistive effect element formed on the active area and storing data by a change in resistance value, a gate electrode of a cell transistor formed on each side of the magnetoresistive effect element on the active area in a second direction, a bit line contact formed on the active area and arranged alternately with the magnetoresistive effect element, a first bit line connected to the magnetoresistive effect, and a second bit line connected to the bit line contact.

19 Claims, 8 Drawing Sheets

MAGNETORESISTIVE RANDOM ACCESS MEMORY DEVICE

CROSS REFERENCE TO RELATED APPLICATION

This application is based upon and claims the benefit of priority from prior Japanese Patent Application No. 2009-165933, filed on Jul. 14, 2009, the entire contents of which are incorporated herein by reference.

TECHNICAL FIELD

The invention relates to a magnetic random access memory device provided with memory cells including magnetoresistive effect elements.

BACKGROUND

In recent years, a spin injection type magnetoresistive random access memory (MRAM) has been proposed, for example, in JP-2002-353418 (KOKAI).

In the spin injection type magnetic MRAM, a tunneling magnetoresistance effect (TMR) element or a magnetic tunnel junction (MTJ) element, which is configured in a sandwich structure of "ferromagnetic material/insulating material/ferromagnetic material", is used as a memory element.

Each element is used as a memory in such a manner that a spin of one ferromagnetic material layer is fixed (fixed layer or pin layer) and a spin of another ferromagnetic material layer is controlled (free layer), to change resistance within the sandwich structure.

However, the spin injection type MRAM has a large writing current to pass through memory cells during writing operation.

In a case where one memory cell is configured of one cell transistor and one MTJ element, an area of the one memory cell is defined by a value of a current flowing in the cell transistor or the cell transistor capable of passing a prescribed current.

For this reason, there has been a problem on the area of the memory cell being not reducible.

SUMMARY

An aspect of the present disclosure, there is provided a magnetoresistive random access memory device, including, an active area formed on a semiconductor substrate in a first direction, a magnetoresistive effect element formed on the active area and storing data by a change in resistance value, a gate electrode of a cell transistor formed on each side of the magnetoresistive effect element on the active area in a second direction orthogonal to the first direction, a bit line contact formed on the active area on the opposite side of the gate electrode of the cell transistor to the magnetoresistive effect element, and arranged alternately with the magnetoresistive effect element while sandwiching the gate electrodes therebetween, a first bit line connected to the magnetoresistive effect element and formed in the first direction, and a second bit line connected to the bit line contact and formed in the first direction.

DETAILED DESCRIPTION

Figure 1:
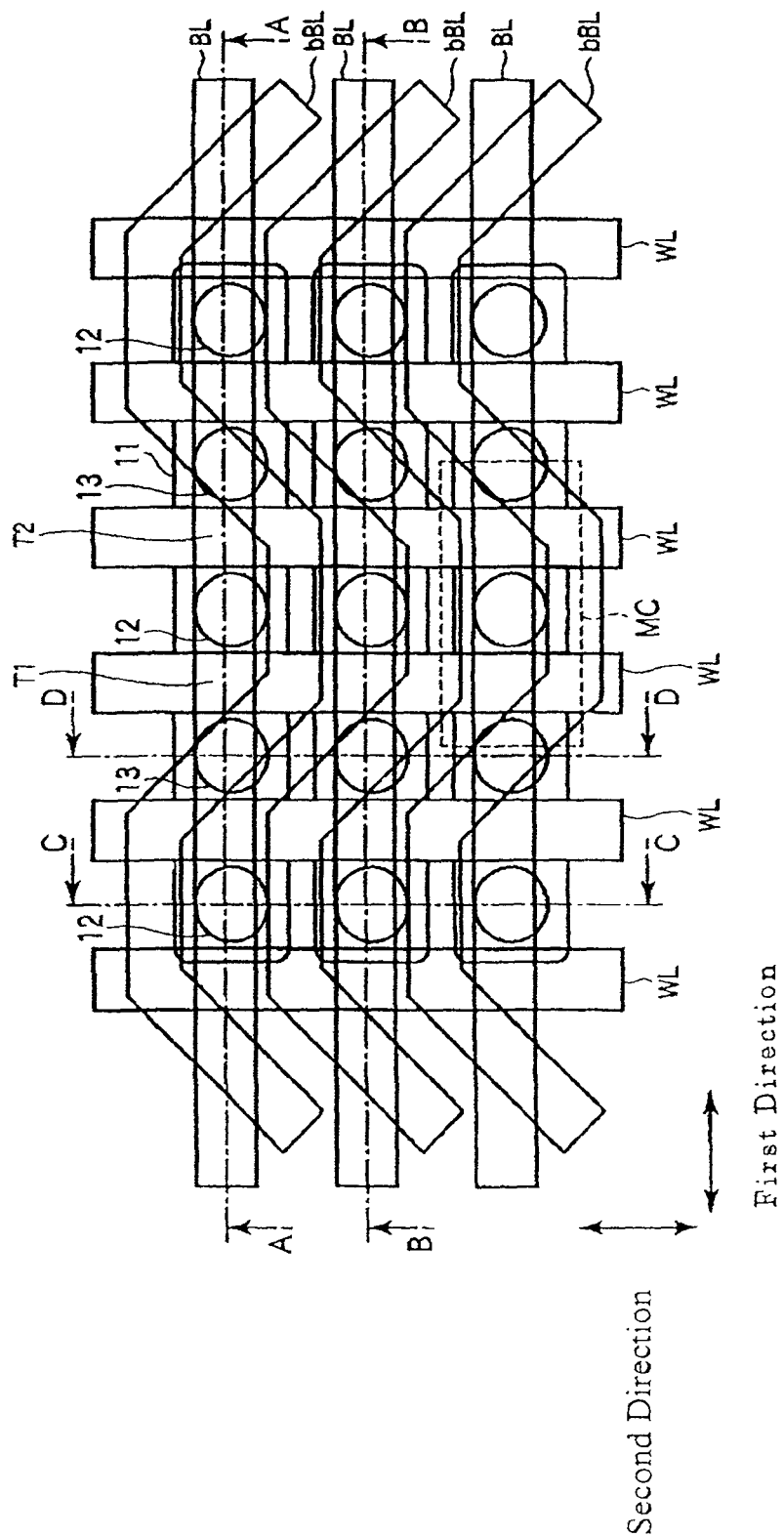
FIG. 1 is a layout diagram showing a configuration of a magnetic random access memory device of a first embodiment of the invention.

Embodiments of the present disclosure will be described below in detail with reference to the drawing mentioned above.

First Embodiment

First, a magnetic random access memory device of a first embodiment of the invention is described.

FIG. 1 is a layout diagram showing a configuration of a magnetic random access memory device of the first embodiment. This figure shows a layout of an active area 11, a magnetoresistive effect element (hereinafter referred to as MTJ element) 12, a bit line contact 13, a bit line BL, a bit line bBL and a word line WL, which are formed on a semiconductor substrate. The MTJ element 12 stores data by a change in resistance value.

As shown in FIG. 1, the active area 11 is linearly formed along a first direction in the semiconductor substrate. The active area 11 has a linear shape, namely a rectangular shape, and a longitudinal direction of the active area 11 is arranged in parallel with the first direction. The active area 11 includes channel regions, source regions and drain regions of the cell transistors T1, T2, and is continuously formed in the first direction without interruption.

The MTJ element 12 is formed on the active area 11. On both sides of the MTJ element 12 on the active area 11, gate electrodes (word lines) WL of the cell transistors T1, T2 are respectively formed in a second direction orthogonal to the first direction. The cell transistors T1, T2 are respectively formed at intersections of the active area 11 and the word lines WL. The gate electrodes WL of the cell transistors T1, T2 and a distance between the gate electrodes are formed in minimum processing size.

A bit line contact 13 is formed on the opposite side of each of the word lines WL to the MTJ elements 12 on the active area 11. Namely, the MTJ element 12 and the bit line contact 13 are alternately arranged with the gate electrode WL sandwiched therebetween.

Further, the bit line BL is connected to the MTJ element 12, and formed along the first direction. The bit line BL has a linear shape. The bit line bBL is connected to the bit line contact 13 and formed in the first direction.

The bit line bBL is made up of a shape having an oblique line with, for example, 45 degrees with respect to a straight line in parallel with the first direction, or a curved line.

The bit line BL and the bit line bBL are arranged so as to intersect with each other as seen from above. The inside of a broken line indicated with symbol MC shows an area required as one memory cell.

Figure 2:
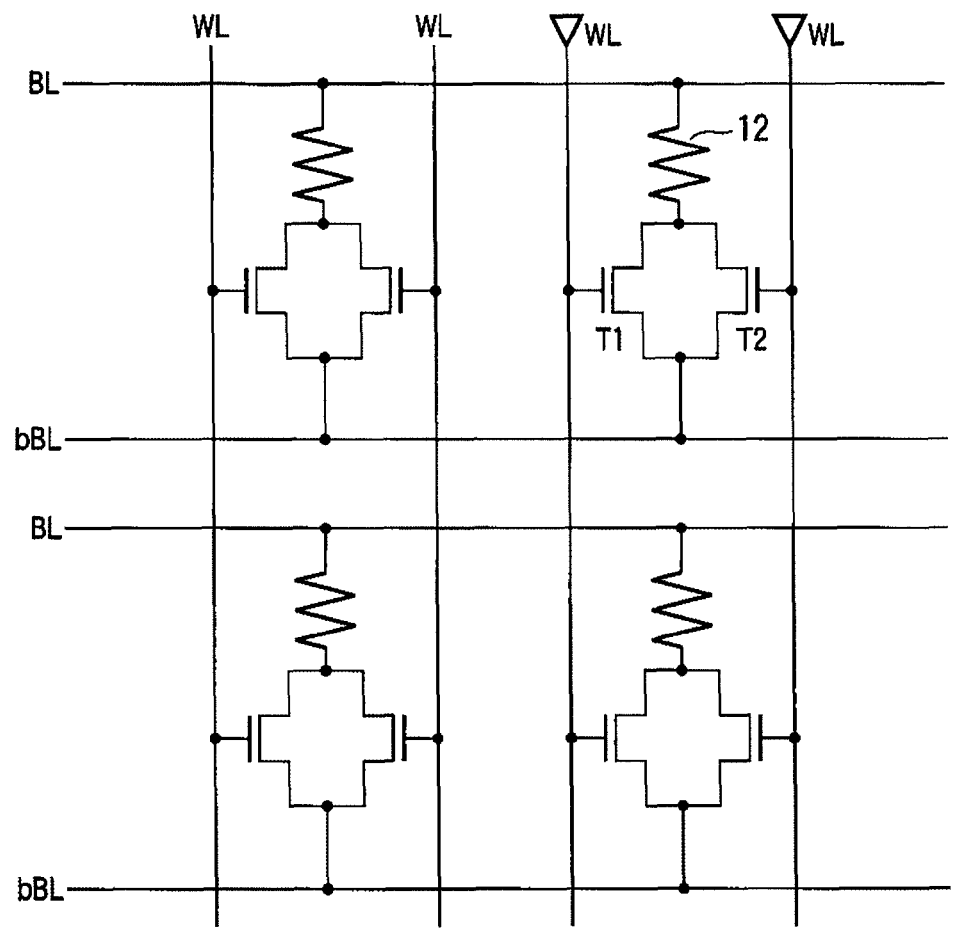
FIG. 2 is an equivalent circuit diagram of a memory cell in the magnetic random access memory device of the first embodiment.

Next a circuit configuration of a memory cell in the magnetic random access memory device in the first embodiment is described. FIG. 2 is an equivalent circuit diagram of a memory cell in the magnetic random access memory device of the first embodiment.

One memory cell in the magnetic random access memory device is configured of the MTJ element 12 and the cell transistors T1, T2.

One end of the MTJ element 12 is connected with the bit line BL. The other end of the MTJ element 12 is connected with each drain of the cell transistors T1, T2. Each source of the cell transistors T1, T2 is connected with the bit line bBL. Further, gates of the cell transistors T1, T2 is respectively connected with the word lines WL.

In such a memory cell, two word lines WL are selected at the time of writing, and the cell transistors T1, T2 come into an ON-state. Predetermined voltages are then applied respectively to the bit line BL and the bit line bBL. This passes a writing current through the MTJ element 12, to change the resistance value of the MTJ element 12.

Next, a sectional structure of the magnetic random access memory device shown in FIG. 1 is described in detail with reference to sectional views shown in FIGS. 3A and 3B and FIGS. 4A and 4B.

Figures 3A, 3B:
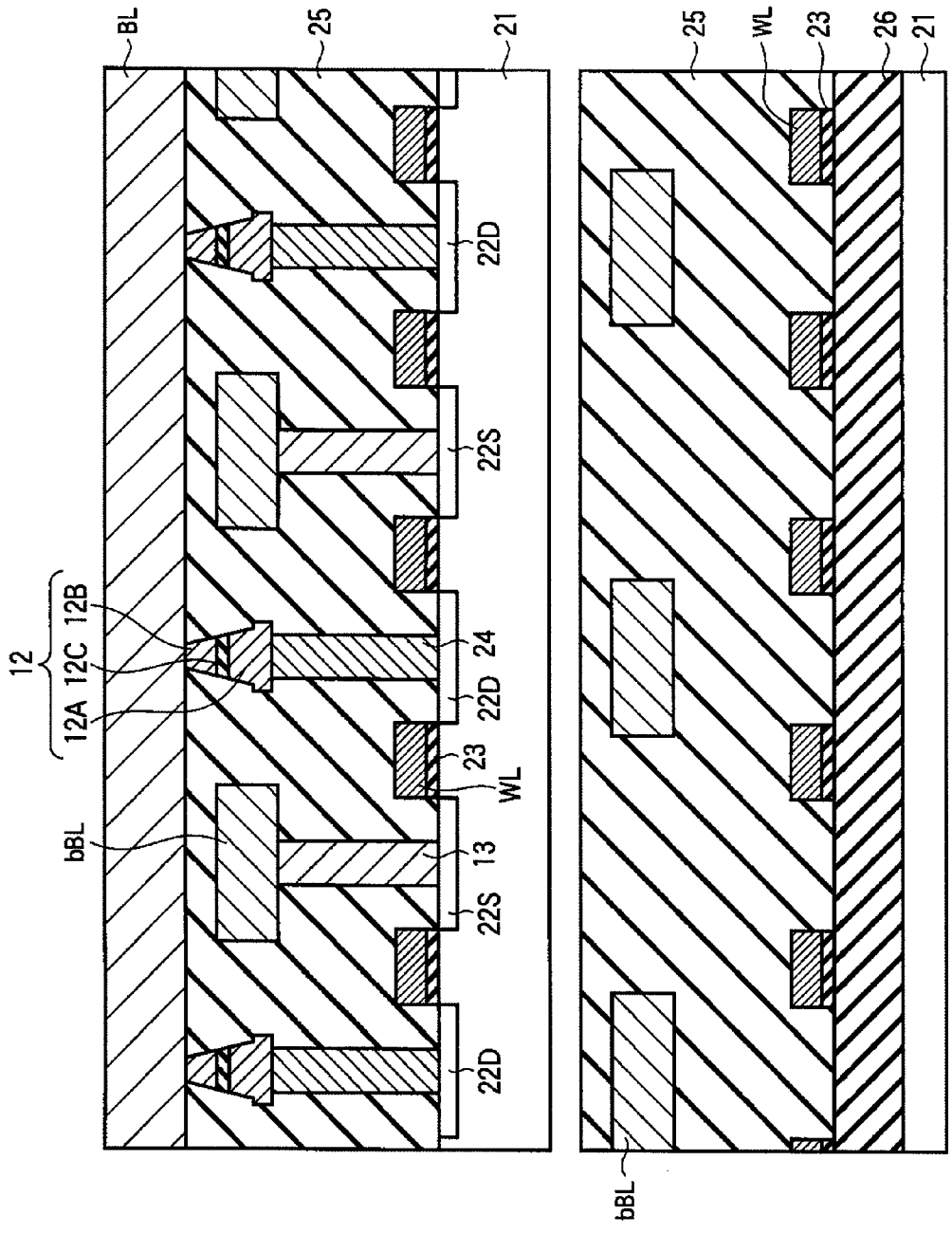
FIGS. 3A and 3B are sectional views along a line A-A and a line B-B of the magnetic random access memory device, respectively, shown in FIG. 1.
Figure 4A:
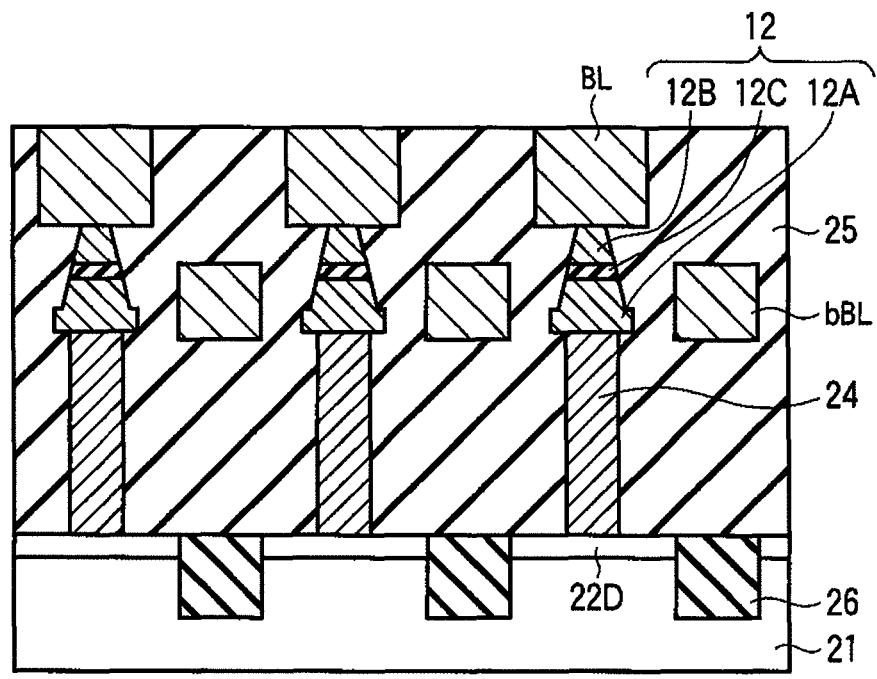
FIGS. 4A and 4B are sectional views along a line C-C and a line D-D of the magnetic random access memory device, respectively, shown in FIG. 1.
Figure 4B:
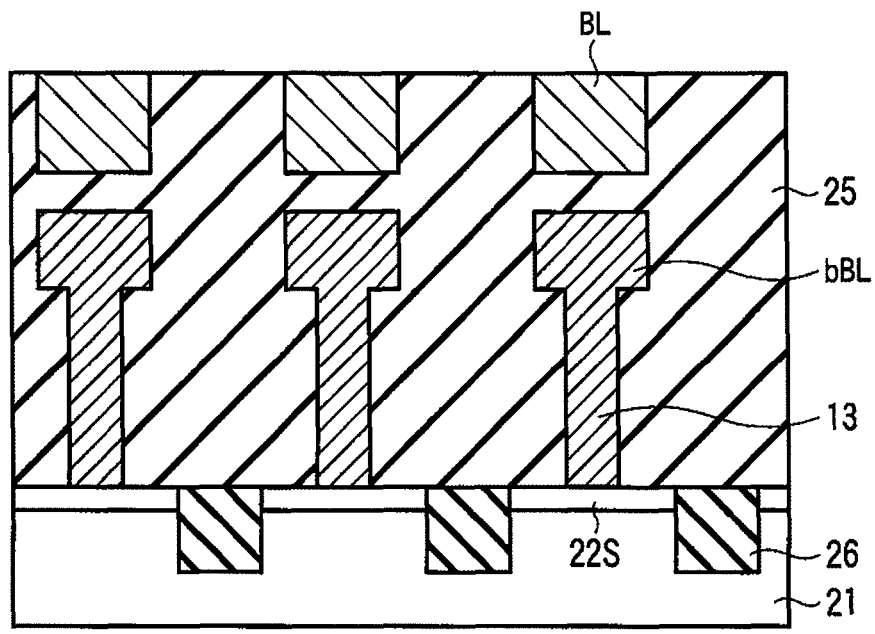

FIGS. 3A and 3B are sectional views along a line A-A and a line B-B of the magnetic random access memory device, respectively, shown in FIG. 1. FIGS. 4A and 4B are sectional views along a line C-C and a line D-D of the magnetic random access memory device, respectively, shown in FIG. 1. Those figures are partly omitted.

The cross section along the line A-A of the magnetic random access memory device has a structure as follows. As shown in FIG. 3A, a source region 22S and a drain region 22D are formed in an isolated manner on the semiconductor substrate 21 (including the active area 11). A gate insulating film 23 is formed on the semiconductor substrate 21 between the source region 22S and the drain region 22D which are adjacent to each other, and the gate electrodes WL of the cell transistors T1, T2 are formed on the gate insulating films 23.

A contact 24 is formed on the drain region 22D, and the MTJ element 12 is formed on the contact 24. The MTJ element 12 is configured of ferromagnetic material layers 12A, 12B and an insulating layer 12C arranged between these ferromagnetic material layers 12A, 12B. Further, the bit line BL is formed on the MTJ element 12.

The bit line contact 13 is formed on the source region 22S, and the bit line bBL is formed on the bit line contact 13. Further, an interlayer insulating film 25 is formed between the semiconductor substrate 21 and the bit lines BL, bBL. The bit line BL and the bit line bBL are formed so as to have different heights from the semiconductor substrate 21.

The cross section along the line B-B of the magnetic random access memory device has a structure as follows. As shown in FIG. 3B, an element isolation insulating film 26 is formed on the semiconductor substrate 21. The gate insulating film 23 is formed on the element isolation insulating film 26, and the word line WL is formed on the gate insulating film 23. Further, above the position between the word lines WL, the bit line bBL is formed through the interlayer insulating film 25.

The cross section along the line C-C of the magnetic random access memory device has a structure as follows. As shown in FIG. 4A, the drain region 22D and the element isolation insulating film 26 are alternately formed on the semiconductor substrate 21. The contact 24 is formed on the drain region 22D, and the MTJ element 12 is formed on the contact 24. The bit line BL is formed on the MTJ element 12. Further, above the element isolation insulating film 26, the bit line bBL is formed through the interlayer insulating film 25.

The cross section along the line D-D of the magnetic random access memory device has a structure as follows. As shown in FIG. 4B, the source region 22S and the element isolation insulating film 26 are alternately formed on the semiconductor substrate 21. The bit line contact 13 is formed on the source region 22S, and the bit line bBL is formed on the bit line contact 13. Further, above the bit line bBL, the bit line BL is formed through the interlayer insulating film 25.

In the magnetic random access memory device of the first embodiment, the MTJ element 12 is connected with the two cell transistors T1, T2. A current passing through the transistor is defined by a channel width W of the transistor. Therefore, when the number of cell transistors to be connected to the MTJ element 12 is two, an amount of writing current passing through the MTJ element 12 in writing operation can be set twice as large.

Further, as shown in FIG. 1, the bit line BL and the bit line bBL are formed in the same direction. This structure can reduce charging/discharging time required for voltage change in the bit line BL and the bit line bBL. The reason for this phenomenon is explained as follows. For example, as a comparative example, it is possible to make a layout where the bit line bBL (source line) is formed along the same direction as the word line WL. In this case, however, the charging/discharging a large number of memory cells are necessary in order to change the voltage of the bit line bBL, thereby to increase the charging/discharging time for the bit line bBL. This causes a problem of increasing the power consumption and decreasing the operation speed. In the embodiment, the bit line BL and the bit line bBL are formed in the same direction, thereby to require charging/discharging of only the bit line BL and the bit line bBL of the selected memory cell so that the above problem can be solved.

Further, in the embodiment, as shown in FIG. 1, the cell transistors are arranged on the right and left with the MTJ element at the center. A bit line contact is arranged on the opposite side of the cell transistor to the MTJ element. Further, another cell transistor is arranged on the opposite side of the bit line contact to the cell transistor.

With such arrangement, element isolation can be performed with respect to each memory cell in an OFF-state cell transistor, thereby eliminating the need for forming the element isolation insulating film in the active area in the first direction (bit-line direction). Namely, the active area need not be isolated with respect to each memory cell, but can be continuously formed in the first direction.

Accordingly, when the minimum line width and the minimum space are set as "F", as indicated by symbol MC in FIG. 1, one memory cell is formed in a region of "4×F" in the first direction (bit line direction) by "2×F" in the second direction (word line direction), so that a memory cell having a small area can be formed.

Further, in the fabricating process, the bit line contacts 13 and the contacts 24 are formed at equivalent intervals in the first direction on the active area, leading to favorable processing controllability of these contacts 13, 24.

Further, as shown in FIG. 3A, the bit line bBL and the MTJ element 12 are formed so as to have the same height. For the reason mentioned above, the bit line contact 13 and the contact 24 that are formed under the bit line bBL and the MTJ element 12 can be formed concurrently with the same height. This process can facilitate the fabricating processing of the bit line contact 13 and the contact 24.

As described above, according to the first embodiment, it is possible to form a memory cell with a small area, so as to provide a magnetic random access memory device capable of having a large capacity.

(Modification)

Next, a modified embodiment of the magnetic random access memory device of the first embodiment is described.

Figure 5:
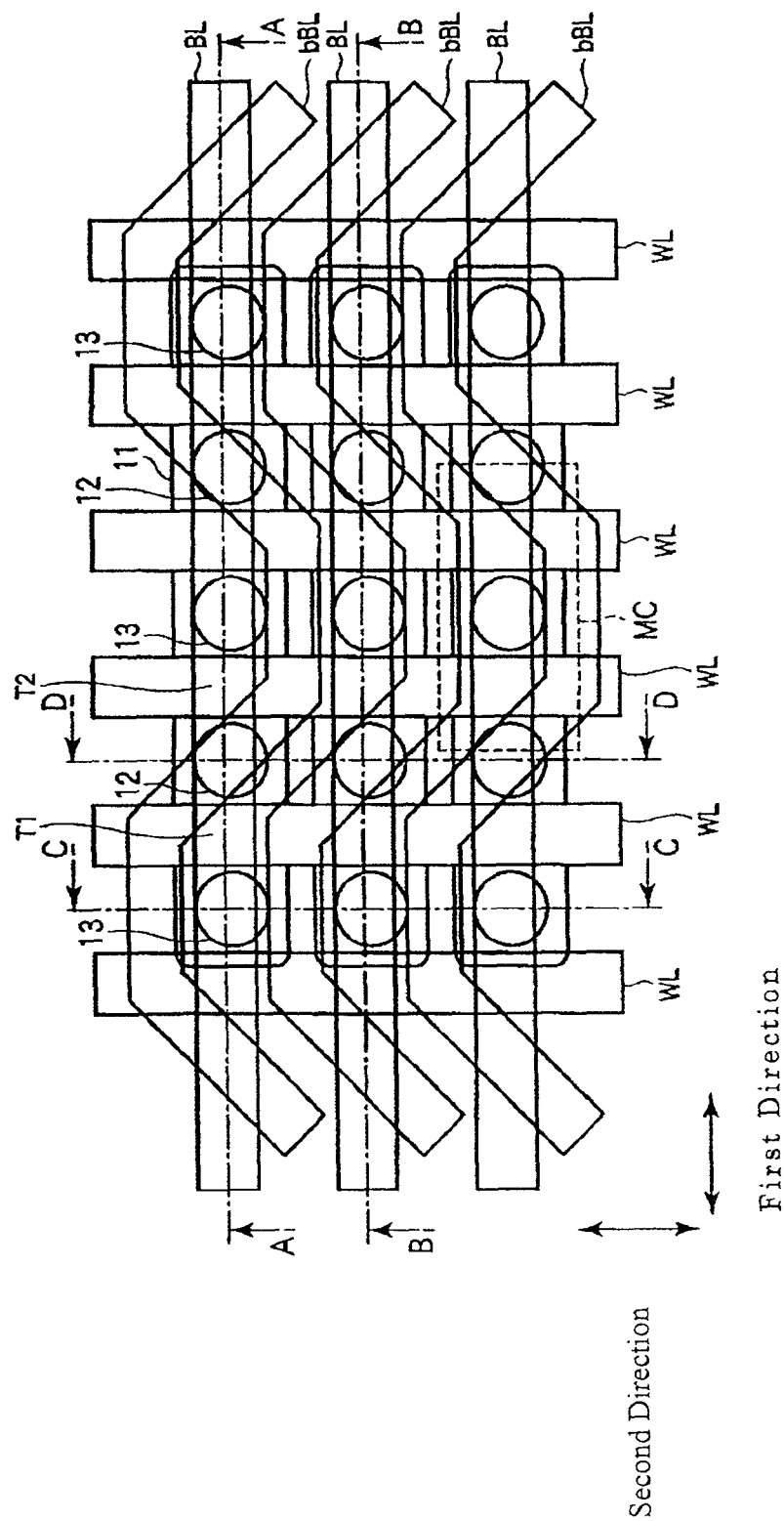
FIG. 5 is a layout diagram showing a configuration of a magnetic random access memory device as a modified embodiment of the first embodiment.

FIG. 5 is a layout diagram showing a configuration of a magnetic random access memory device as the modified embodiment of the first embodiment.

In the first embodiment shown in FIG. 1, the bit line BL is connected to the MTJ element 12 and the bit line bBL is connected to the source region 22S through the bit line contact 13, whereas in the modified embodiment, the bit line bBL is connected to the MTJ element 12 and the bit line BL is connected to the drain region 22D through the bit line contact 13. The other configurations are the same as those in the first embodiment.

Next, a sectional structure of the magnetic random access memory device shown in FIG. 5 is described in detail with reference to sectional views shown in FIGS. 6A and 6B and FIGS. 7A and 7B.

Figures 6A, 6B:
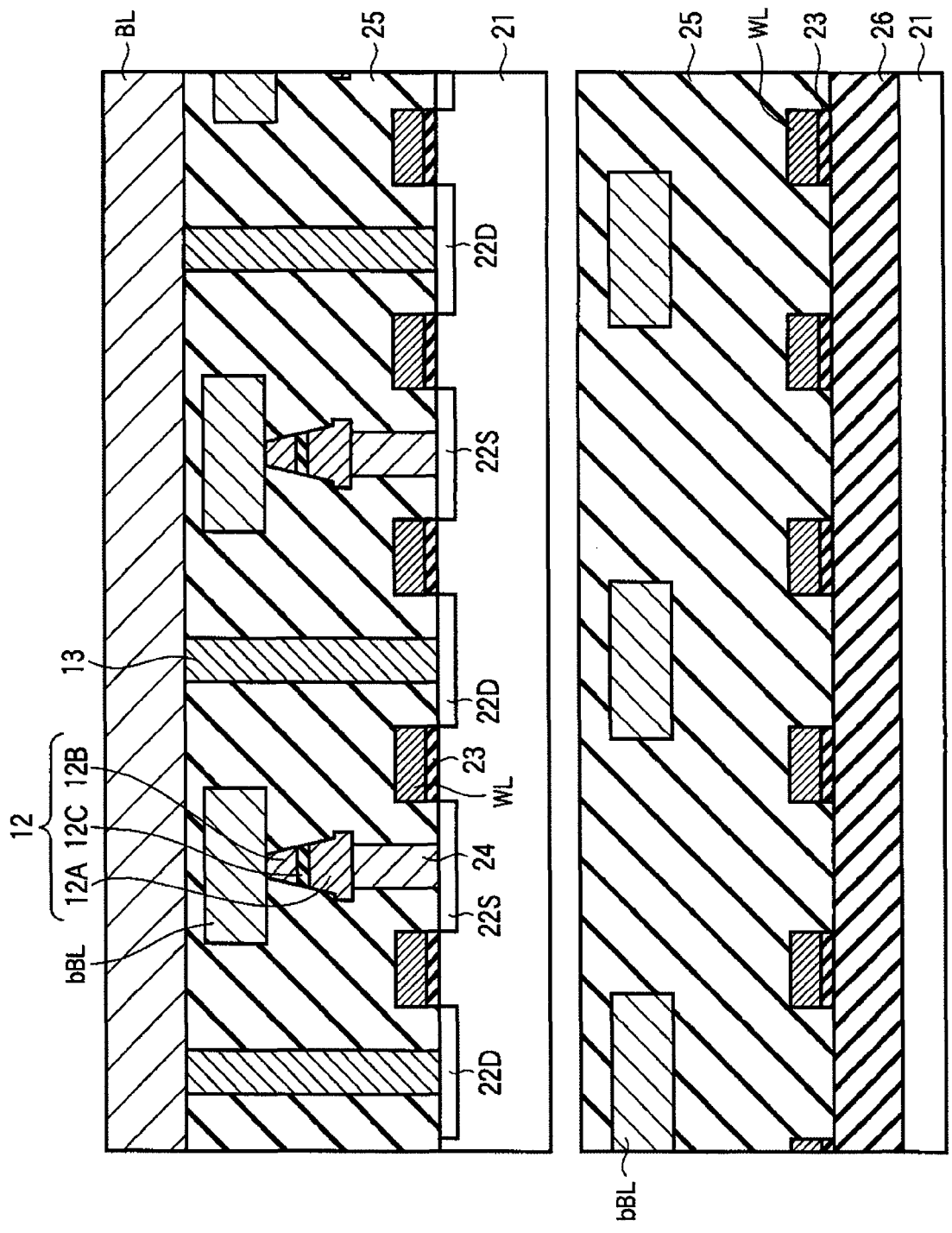
FIGS. 6A and 6B are sectional views along a line A-A and a line B-B of the magnetic random access memory device, respectively, shown in FIG. 5.
Figure 7A:
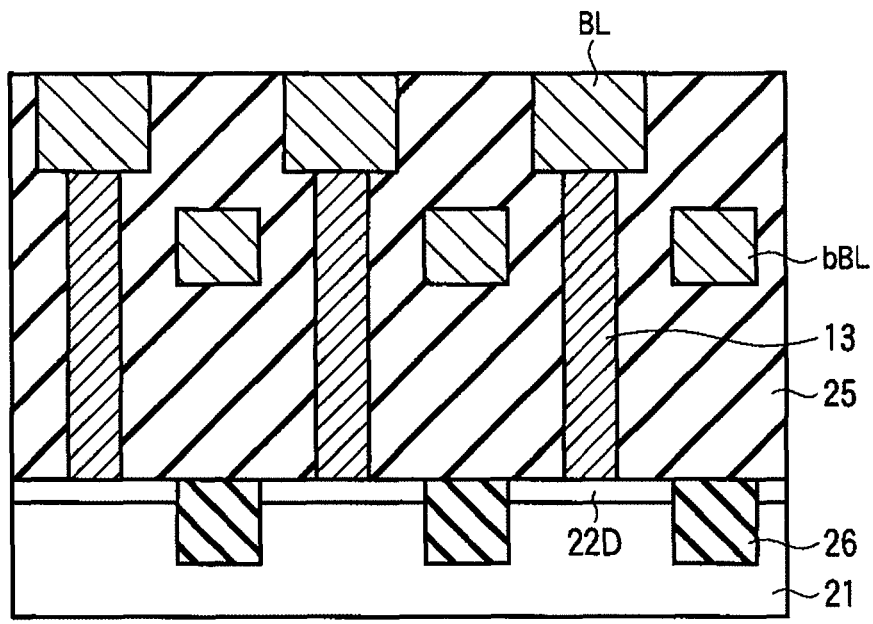
FIGS. 7A and 7B are sectional views along a line C-C and a line D-D of the magnetic random access memory device, respectively, shown in FIG. 5.
Figure 7B:
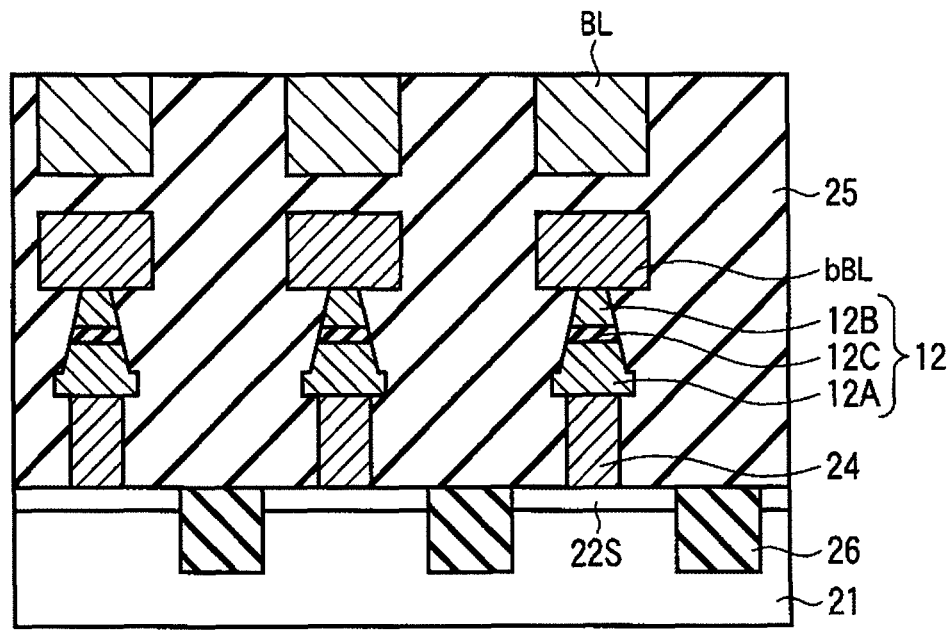

FIGS. 6A and 6B are sectional views along a line A-A and a line B-B of the magnetic random access memory device, respectively, shown in FIG. 5. FIGS. 7A and 7B are sectional views along a line C-C and a line D-D of the magnetic random access memory device, respectively, shown in FIG. 5. Those figures are partly omitted.

The cross section along the line A-A of the magnetic random access memory device has a structure as follows. As shown in FIG. 6A, the source region 22S and the drain region 22D are formed in a separated manner on the semiconductor substrate 21 including the active area 11. The gate insulating film 23 is formed in between the source region 22S and the drain region 22D which are adjacent to each other on the semiconductor substrate, and the gate electrodes WL of the cell transistors T1, T2 are formed on the gate insulating film 23.

The bit line contact 13 is formed on the drain region 22D, and the bit line BL is formed on the bit line contact 13. The contact 24 is formed on the source region 22S, and the MTJ element 12 is formed on the contact 24. Further, the bit line bBL is formed on the MTJ element 12. Moreover, the interlayer insulating film 25 is formed in between the semiconductor substrate 21 and the bit lines BL, bBL.

The cross section along the line B-B of the magnetic random access memory device has a structure as follows. As shown in FIG. 6B, the element isolation insulating film 26 is formed on the semiconductor substrate 21. The gate insulating film 23 is formed on the element isolation insulating film 26, and the word line WL is formed on the gate insulating film 23. Further, above the position between the word lines WL, the bit line bBL is formed through the interlayer insulating film 25.

The cross section along the line C-C of the magnetic random access memory device has a structure as follows. As shown in FIG. 7A, the drain region 22D and the element separating insulating film 26 are alternately formed on the semiconductor substrate 21. The bit line contact 13 is formed on the drain region 22D, and the bit line BL is formed on the bit line contact 13. Further, above the element separating insulating film 26, the bit line bBL is formed through the interlayer insulating film 25.

The cross section along the line D-D of the magnetic random access memory device has a structure as follows. As shown in FIG. 7B, the source region 22S and the element isolation insulating film 26 are alternately formed on the semiconductor substrate 21. The contact 24 is formed on the source region 22S, and the MTJ element 12 is formed on the contact 24. The bit line bBL is formed on the MTJ element 12. Further, above the bit line bBL, the bit line BL is formed through the interlayer insulating film 25.

As thus described, even in the case where the connection between the bit line BL and the bit line bBL in the first embodiment is switched to the connection of the bit line bBL to the MTJ element 12 and the connection of the bit line BL to the drain region 22D through the bit line contact 13, a similar effect to that in the first embodiment can be obtained.

Second Embodiment

Next, a magnetic random access memory device of a second embodiment of the invention is described.

Figure 8:
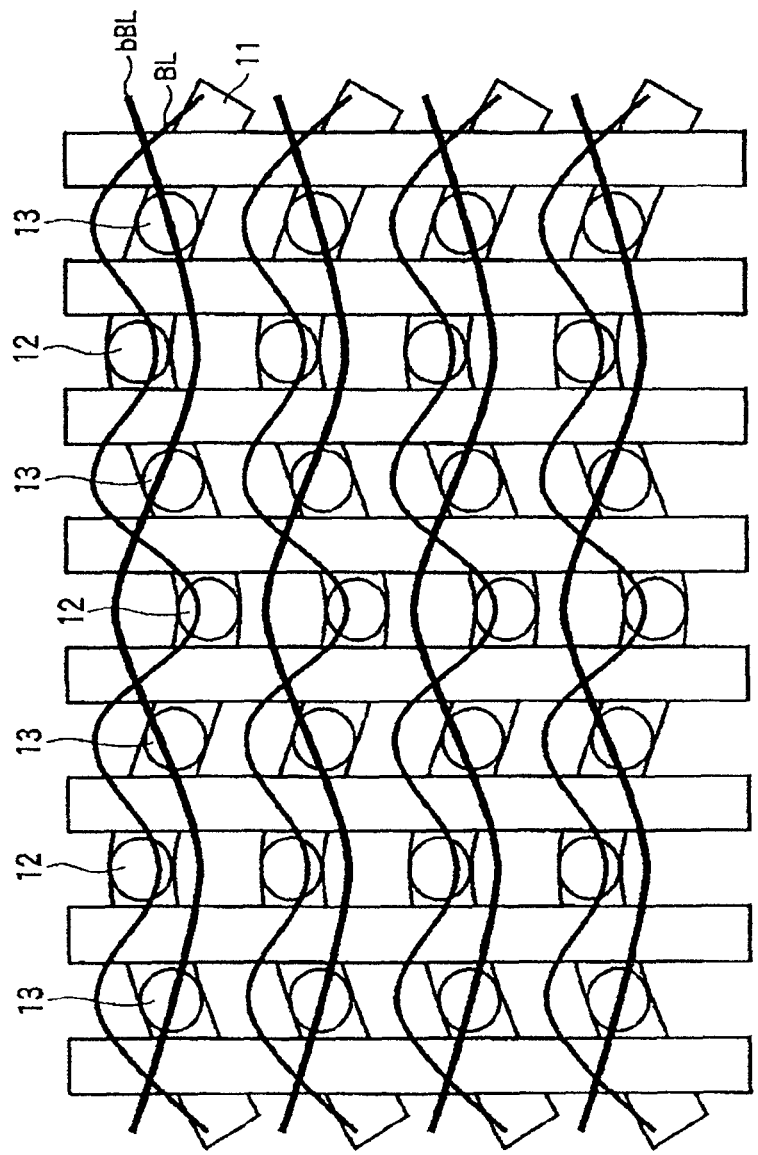
FIG. 8 is a layout diagram showing a configuration of a magnetic random access memory device of a second embodiment of the invention.

FIG. 8 is a layout diagram showing a configuration of the magnetic random access memory device of the second embodiment.

In the first embodiment, the active area 11 and the bit line BL are linearly arranged in the first direction, and the bit line bBL is formed of the straight line in parallel with the first direction and an oblique line with a predetermined angle, e.g. 45 degrees, with respect to the first direction. However, in the second embodiment, as shown in FIG. 8, the active area 11, the bit line BL and the bit line bBL are formed of curved lines in the first direction. Namely, the active area 11, the bit line BL and the bit line bBL each have a curvilinear shape.

In the second embodiment, the bit line BL and the bit line bBL are formed in the same first direction, and the bit line BL and the bit line bBL are formed as different layers in order to reduce the area of the memory cell. Further, contacts to the bit line BL and the bit line bBL are respectively formed on the MTJ element 12 and the active area 11.

Moreover, for the purpose of reduction in area of the memory cell, the bit line BL, the bit line bBL, the bit line contact 13 and the contact 24 (or the MTJ element 12) are arranged closely to one another, and the bit line contact 13 and the contact 24 have a self-align contact (SAC) structure. That is, the bit line contact 13 and the contact 24 are formed in self-aligning.

As shown in FIG. 1, in the first embodiment, the bit line bBL is the curved line or the oblique line with 45 degrees, and fabrication becomes not easy with the curvature of the curved line or the angle of the oblique line being large.

In the second embodiment, in order to facilitate the fabrication, the active area 11 connected to the bit line BL is also formed in a curved line, and the bit line BL and the bit line bBL are also formed in curved lines, whereby a curvature required for forming the bit lines and the area are shared by the three patterns. Namely, the active area 11, the bit line BL and the bit line bBL are formed in curvilinear shape, thereby reducing the curvature of the bit line bBL, or the angle of the bit line bBL with respect to the first direction in the first embodiment. This can facilitate fabricating of the magnetic random access memory device in the second embodiment. Other configurations and effects are similar to those in the first embodiment.

It is to be noted that, although the embodiment was shown here in which the active area 11, the bit line BL and the bit line bBL all have the curvilinear shape, at least one of the active area 11, the bit line BL and the bit line bBL may be formed so as to have the curvilinear shape.

Further, each of the foregoing embodiments can be implemented in appropriate combination as well as individually. Moreover, each of the foregoing embodiments includes inventions on a variety of stages, and it is possible to extract inventions on a variety of stages by appropriate combination of a plurality of constituents shown in the embodiments.

What is claimed is:

1. A magnetoresistive random access memory device, comprising:
a plurality of memory cells, each of the memory cells comprising:
a magnetoresistive effect element above an active area extending in a first direction on a semiconductor substrate, the magnetoresistive effect element configured to store data from a change in a resistance value;
a pair of cell transistors on the active area on both sides of the magnetoresistive effect element, a gate electrode of each of the cell transistors being in a second direction orthogonal to the first direction;
a pair of bit line contacts on the active area on a side of each of the gate electrodes opposite to the magnetoresistive effect element;
a first bit line in the first direction connected to the magnetoresistive effect element; and
a second bit line in the first direction connected to the bit line contacts,
wherein each of the bit line contacts is shared by each of the adjacent memory cells and a width of the active area in the second direction is substantially the same as the width of the bit line contacts.

2. The device of claim 1, wherein
at least one of the active area, the first bit line and the second bit line comprises a curvilinear shape.

3. The device of claim 1, wherein
the first bit line comprises a linear shape, and the second bit line comprises a first oblique linear shape with respect to the first bit line.

4. The device of claim 1, wherein
a width of the gate electrode of the cell transistor in the first direction and a distance between the adjacent gate electrodes in the first direction are substantially the same as the width of the bit line contacts.

5. The device of claim 1, wherein
a height of the first bit line from the semiconductor substrate and a height of the second bit line from the semiconductor substrate are different.

6. The device of claim 5, wherein
a height of the first bit line from the semiconductor substrate is higher than a height of the second bit line from the semiconductor substrate.

7. The device of claim 1, wherein
each of the cell transistors comprises shared source/drain regions in the active area to share each of the shared source/drain regions with a cell transistor of each of the adjacent cells.

8. The device of claim 7, wherein
the magnetoresistive effect element is above one of the shared source/drain regions, and a bottom of a ferromagnetic material layer in a lower portion of the magnetoresistive effect element and the one of the shared source/drain regions are connected to each other through a contact, and the bit line contact is on the other of the shared source/drain region.

9. The device of claim 1, wherein the active area is a strip shape along the first direction.

10. A magnetoresistive random access memory device, comprising:
a plurality of memory cells, each of the memory cells comprising:
a magnetoresistive effect element above an active area extending in a first direction on a semiconductor substrate, the magnetoresistive effect element configured to store data from a change in a resistance value;
a pair of cell transistors on the active area on both sides of the magnetoresistive effect element, a gate electrode of each of the cell transistors being in a second direction orthogonal to the first direction;
a pair of bit line contacts on the active area on a side of each of the gate electrodes opposite to the magnetoresistive effect element;
a first bit line in the first direction connected to the magnetoresistive effect element; and
a second bit line in the first direction connected to the bit line contacts,
wherein each of the bit line contacts is shared by each of the adjacent memory cells and a width of the active area in the second direction is substantially smaller than twice as large as a width of the bit line contact in the second direction.

11. The device of claim 10, wherein
at least one of the active area, the first bit line and the second bit line comprises a curvilinear shape.

12. The device of claim 10, wherein
the first bit line comprises a linear shape, and the second bit line comprises a first oblique linear shape with respect to the first bit line.

13. The device of claim 10, wherein
a width of the gate electrode of the cell transistor in the first direction and a distance between the adjacent gate electrodes are substantially the same as the width of the bit line contacts.

14. The device of claim 10, wherein
a height of the first bit line from the semiconductor substrate and a height of the second bit line from the semiconductor substrate are different.

15. The device of claim 14, wherein
a height of the first bit line from the semiconductor substrate is higher than a height of the second bit line from the semiconductor substrate.

16. The device of claim 10, wherein
the first bit line and the second bit line intersect with each other from a top view.

17. The device of claim 10, wherein
each of the cell transistors, comprise shared source/drain regions to share each of the shared source/drain regions with a cell transistor of each of the adjacent cells.

18. The device of claim 17, wherein
the magnetoresistive effect element is above one of the shared source/drain region, and a bottom of a ferromagnetic material layer in a lower portion of the magnetoresistive effect element and the one of the shared source/drain regions are connected to each other through a contact, and the bit line is on the other of the shared source/drain region.

19. The device of claim 10, wherein the active area is a strip shape along the first direction.

* * * * *